United States Patent
Wang et al.

(10) Patent No.: US 9,515,741 B2
(45) Date of Patent: Dec. 6, 2016

(54) OPTICAL TRANSCEIVER MODULE AND METHOD OF ASSEMBLING THE SAME

(71) Applicant: InnoLight Technology (Suzhou) LTD., Suzhou, Jiangsu (CN)

(72) Inventors: Kewu Wang, Jiangsu (CN); Xiangzhong Wang, Jiangsu (CN); Yuzhou Sun, Jiangsu (CN); Xinjun Zhou, Jiangsu (CN); Xiaoming Xu, Jiangsu (CN)

(73) Assignee: InnoLight Technology (Suzhou) LTD., Suzhou (CN)

( * ) Notice: Subject to any disclaimer, the term of this patent is extended or adjusted under 35 U.S.C. 154(b) by 0 days.

(21) Appl. No.: 14/692,802

(22) Filed: Apr. 22, 2015

(65) Prior Publication Data

US 2015/0341118 A1    Nov. 26, 2015

(30) Foreign Application Priority Data

May 22, 2014   (CN) .......................... 2014 1 0219779

(51) Int. Cl.
*H04B 10/00* (2013.01)
*H04B 10/40* (2013.01)
*H04B 10/25* (2013.01)
*H05K 3/36* (2006.01)
*H04J 14/00* (2006.01)
*G02B 6/42* (2006.01)

(52) U.S. Cl.
CPC ............ *H04B 10/40* (2013.01); *G02B 6/4269* (2013.01); *H04B 10/2503* (2013.01); *H05K 3/361* (2013.01); *G02B 6/4246* (2013.01); *G02B 6/4249* (2013.01); *G02B 6/4272* (2013.01); *G02B 6/4281* (2013.01); *Y10T 29/49128* (2015.01)

(58) Field of Classification Search
CPC ....................................................... H04B 10/40
USPC ................................................. 398/135–139
See application file for complete search history.

(56) References Cited

U.S. PATENT DOCUMENTS

| 2008/0089693 A1* | 4/2008 | El-Ahmadi | H04L 1/0057 398/135 |
| 2009/0067849 A1* | 3/2009 | Oki | G02B 6/4201 398/136 |
| 2011/0102729 A1* | 5/2011 | Kawamura | H05K 3/0052 349/158 |

* cited by examiner

*Primary Examiner* — Daniel Dobson
(74) *Attorney, Agent, or Firm* — Finnegan, Henderson, Farabow, Garrett & Dunner, LLP

(57) ABSTRACT

An optical transceiver module includes a first flexible circuit board and a second flexible circuit board; a light receiving unit and a light transmitting unit disposed on the first flexible circuit board and the second flexible circuit board, respectively; a printed circuit board connected to the first flexible circuit board and the second flexible circuit board, and including a connecting point; and a signal processing unit disposed on at least one of the first flexible circuit board, the second flexible circuit board, and the printed circuit board. The signal processing unit processes optical signals received by the light receiving unit and transmits the signals to the connecting point of the printed circuit board, and processes electrical signals transmitted from the connecting point of the printed circuit board and transmits the signals out through the light transmitting unit.

10 Claims, 4 Drawing Sheets

OPTICAL TRANSCEIVER MODULE AND METHOD OF ASSEMBLING THE SAME

CROSS-REFERENCE TO RELATED APPLICATION

This application claims the benefit of priority to Chinese Application No. 201410219779.6, filed May 22, 2014.

TECHNICAL FIELD

This disclosure relates to optical fiber device manufacturing technology and, more particularly, to an optical transceiver module and a method of assembling the same.

BACKGROUND

Optical communication is currently one of the major methods of communication. With the development of multiplexing optical communication technologies such as Wavelength Division Multiplexing (WDM) and Passive Optical Network (PON), optical communication devices gradually enter into buildings and homes, and optical fibers have gradually extended from backbone networks to Fiber To The Building (FTTB) and Fiber To The Home (FTTH) settings.

Optical transceiver modules are important components for connection in optical communication devices. The research and development of optical transceiver modules have consistently attracted a large amount of attention. Quality control details, such as how to effectively control the quality of optical transceiver modules and how to reduce the effect of rework on the manufacturing cost of optical transceiver modules by reducing the need for rework, cannot be overlooked.

SUMMARY

This disclosure provides an optical transceiver module that can effectively lower the cost of rework in the manufacturing process of the optical transceiver module and can ensure the quality of optical transceiver module.

This disclosure also provides a method of manufacturing an optical transceiver module.

According to an embodiment, an optical transceiver module includes a first flexible circuit board and a second flexible circuit board; a light receiving unit and a light transmitting unit laid out on the first flexible circuit board and the second flexible circuit board, respectively; a printed circuit board connected to the first flexible circuit board and the second flexible circuit board, and including a connecting point; and a signal processing unit disposed on at least one of the first flexible circuit board, the second flexible circuit board, or the printed circuit board. The signal processing unit processes optical signals received by the light receiving unit and transmits the signals to the connecting point of the printed circuit board. The signal processing unit also processes electrical signals transmitted from the connecting point of the printed circuit board and transmits the signals out through the light transmitting unit.

According to a further embodiment, the optical transceiver module includes an outer case. The printed circuit board fits onto and is covered by the outer case. The first flexible circuit board and the second flexible circuit board include main body parts on which the light receiving unit and light transmitting units are set, respectively. The main body parts are located in the outer case and are partially adhered and fixed to a bottom part of the outer case.

According to a further embodiment, the optical transceiver module includes a heat sink disposed on the outside of the outer case.

According to a further embodiment, the optical transceiver module includes a first thermally conductive plate disposed between the first flexible circuit board and the outer case, the first flexible circuit board being adhered and fixed to the outer case through the first thermally conductive plate; and a second thermally conductive plate disposed between the second flexible circuit board and the outer case, the second flexible circuit board being adhered and fixed to the outer case through the second thermally conductive plate.

According to a further embodiment, the optical transceiver module includes thermally conductive adhesive placed between the first thermally conductive plate and the outer case and between the second thermally conductive plate and the body of the outer case.

According to a further embodiment, the first flexible circuit board and the second flexible circuit board are connected to two sides of the printed circuit board.

According to a further embodiment, the optical transceiver module includes supporting parts attached between the first thermally conductive plate and the printed circuit board and between the second thermally conductive plate and the printed circuit board, respectively. The supporting parts respectively include positioning projections on the ends of the supporting parts that correspond to the printed circuit board. The printed circuit board includes a positioning hole that corresponds to the positioning projections. The supporting parts respectively include engaging pieces on the ends of the supporting parts that respectively correspond to the first and second thermally conductive plates. The first and second thermally conductive plates respectively include engaging slots that respectively correspond to the engaging pieces.

According to a further embodiment, the optical transceiver module includes a connector for electrically connecting to the connecting point of the printed circuit board and disposed on a surface of the printed circuit board that faces away from the main body parts of the first and second flexible circuit boards.

According to a further embodiment, the optical transceiver module is connected with optical fibers for transmission of optical signals to the outside.

According to a further embodiment, a method of assembling the aforementioned optical transceiver module includes the following steps.

S1. The light receiving unit and the light transmitting unit are respectively disposed on the first flexible circuit board and the second flexible circuit board.

S2. A reliability screening is conducted for each one of the first flexible circuit board and the second flexible circuit board.

S3. The signal processing unit is disposed on the at least one of the first flexible circuit board, the second flexible circuit board, or the printed circuit board.

S4. The first and second flexible circuit boards that have passed the reliability screening are electrically connected to the printed circuit board.

Setting the light transmitting unit and light receiving unit of the optical transceiver module on two flexible circuit boards allows separate testing of the two flexible circuit boards before they are assembled. When an issue is detected on one of the flexible circuit boards, rework is required for only the flexible circuit board that has the issue rather than for the entire optical transceiver module. As a result, manufacturing cost is reduced.

DETAILED DESCRIPTION OF EMBODIMENTS

The text below provides detailed descriptions of embodiments of the disclosure as shown in the accompanying drawings. Nonetheless, the embodiments do not limit the scope of the disclosure. Any changes made to the structure, method, or function by persons of ordinary skill in the art based on the embodiments are within the scope of this disclosure.

It should be understood that terms such as first and second may be used to describe various components or structures, but the objects described should not be restricted by these terms. These terms are used only to distinguish the objects described. For example, the first flexible circuit board may also be referred to as the second flexible circuit board; similarly, the second flexible circuit board may also be referred to as the first flexible circuit board. Such description does not go against the scope of protection for the invention.

Figure 1:
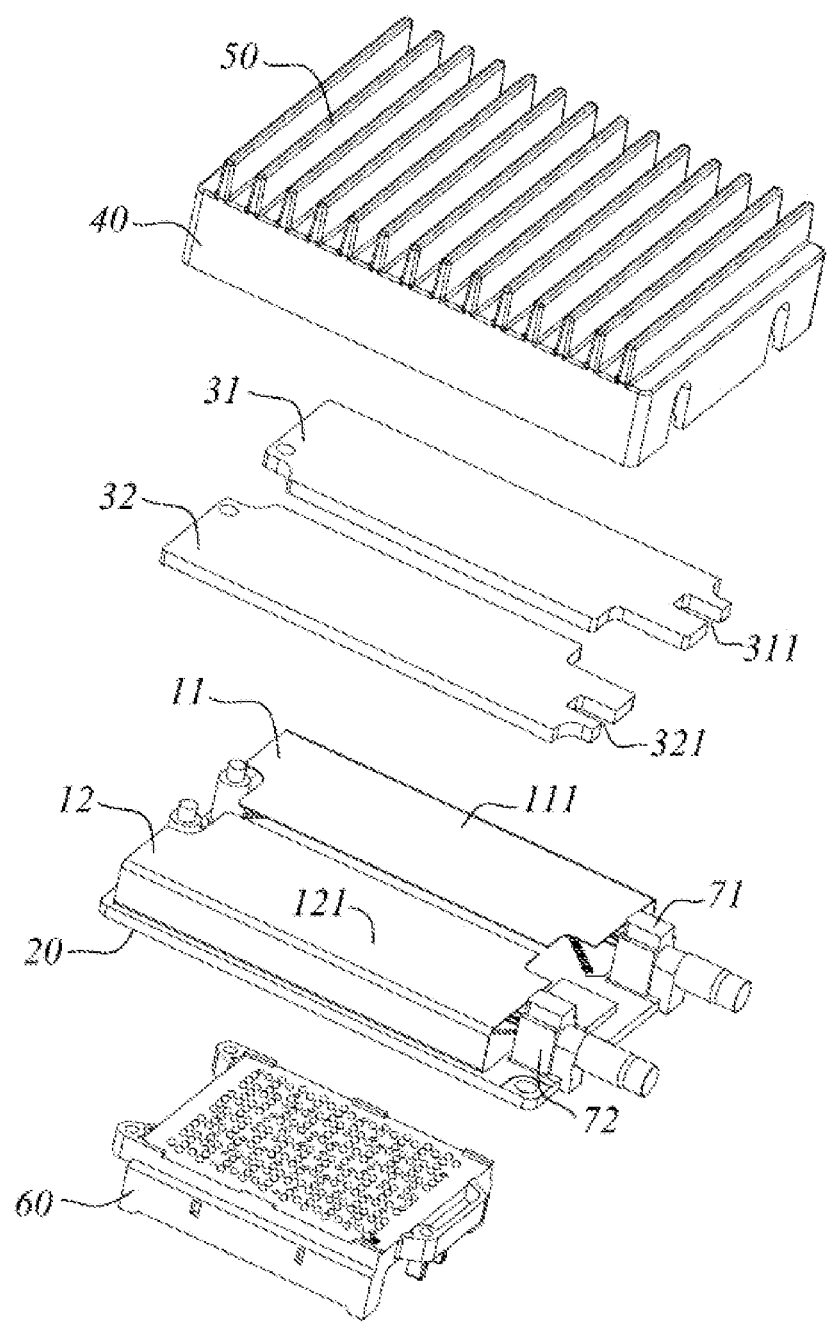
FIG. 1 is an exploded perspective view of an optical transceiver module, according to an embodiment of the disclosure.
Figure 2:
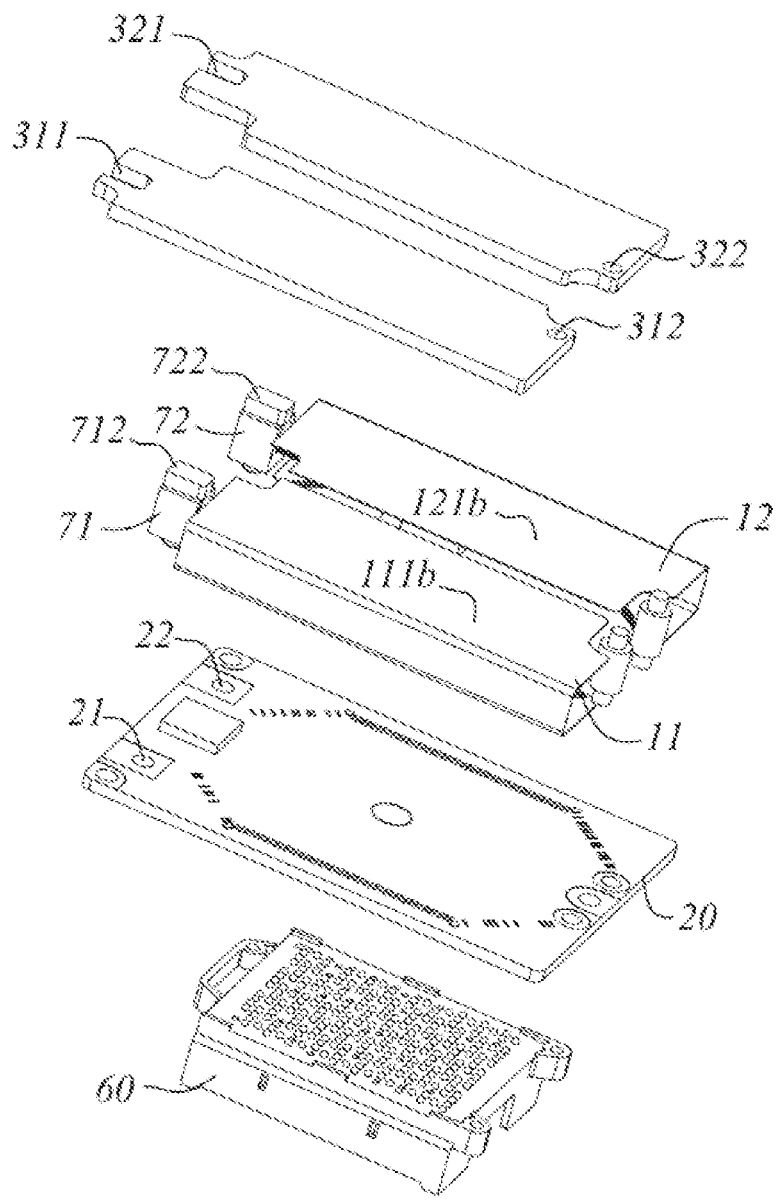
FIG. 2 is an exploded perspective view of the optical transceiver module of FIG. 1, without an outer case, according to an embodiment of the disclosure.
Figure 3:
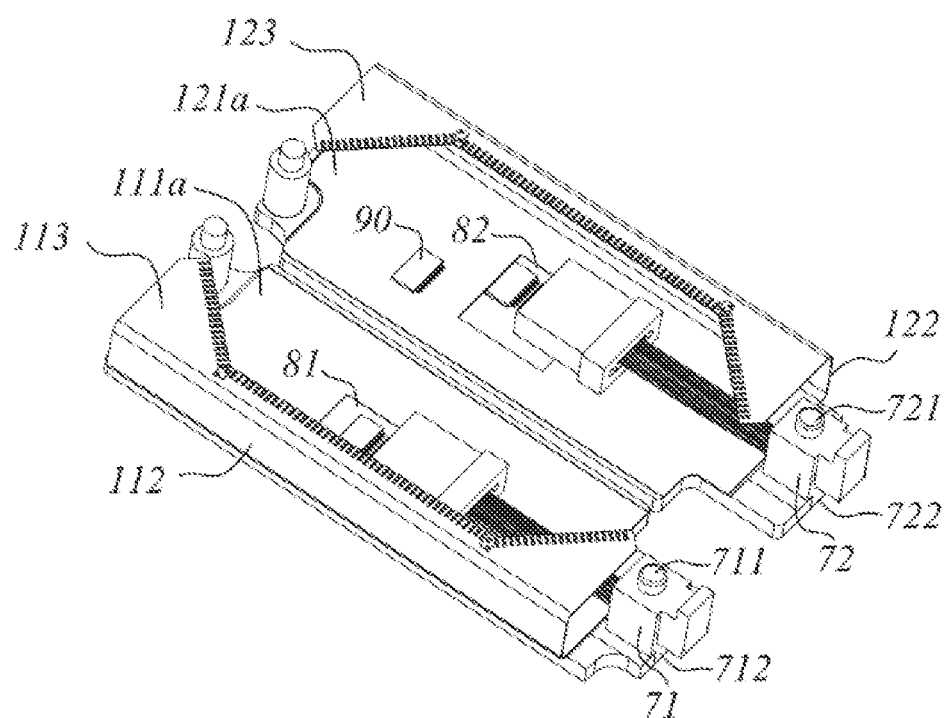
FIG. 3 is a perspective view of an optical transceiver module, showing the connection between a first flexible circuit board and a printed circuit board and between a second flexible circuit board and the printed circuit board, according to an embodiment of the disclosure.

FIGS. 1 through 3 illustrates an optical transceiver module 100 according to an embodiment of the disclosure. As illustrated in FIGS. 1 through 3, the optical transceiver module 100 includes a first flexible circuit board 11, a second flexible circuit board 12, a light receiving unit 81, a light transmitting unit 82, a signal processing unit 90, and a printed circuit board 20.

The first flexible circuit board 11 and the second flexible circuit board 12 are separate from each other. On each one of the first flexible circuit board 11 and the second flexible circuit board 12, a plurality of pads (not shown in the drawings) are reserved for electrically connecting to the printed circuit board 20. During a manufacturing process, the light receiving unit 81 and the light transmitting unit 82 can be disposed on the first flexible circuit board 11 and the second flexible circuit board 12, respectively, and the first flexible circuit board 11 and the second flexible circuit board 12 can be tested through the reserved pads. In this manner, substandard circuit boards are screened out in advance, avoiding the need to rework due to the presence of substandard finished products after the assembling of the entire optical transceiver module 100 is completed. In some alternative embodiments, the light receiving unit 81 and the light transmitting unit 82 may be disposed in other ways according to requirements of the designs. For example, the light receiving unit 81 and light transmitting unit 82 can be disposed on any flexible circuit board, respectively.

Specifically, the first flexible circuit board 11 and the second flexible circuit board 12 respectively include main body parts 111 and 121 that are substantially in the shape of flat boards. The printed circuit board 20 is positioned in a plane different from the plane in which the main body parts 111 and 121 of the first and second flexible circuit boards 11 and 12 are positioned. As the first and second flexible circuit boards 11 and 12 are inherently bendable, the first and second flexible circuit boards 11 and 12 can be electrically connected to the printed circuit board 20 in a bended manner. As a result, the printed circuit board 20 can be positioned in a plane different from the plane in which the first and second flexible circuit boards 11 and 12 are positioned, thereby reducing the size of the optical transceiver module 100. The first flexible circuit board 11 and the second flexible circuit board 12 can be connected to two opposite sides of the printed circuit board 20, as shown in FIG. 1. Alternatively, the first flexible circuit board 11 and the second flexible circuit board 12 can be connected to the same side of the printed circuit boards 20. For example, the first flexible circuit board 11 and the second flexible circuit board 12 can be connected to a side opposite to external optical fibers.

In one embodiment, the main body parts 111 and 121 of the first and second flexible circuit boards 11 and 12 are disposed in a position opposing to the printed circuit board 20. The main body parts 111 and 121 of the first and second flexible circuit boards 11 and 12 respectively include first surfaces 111a and 121a facing the printed circuit board 20, and second surfaces 111b and 121b facing away from the printed circuit board 20. The light receiving unit 81 and light transmitting unit 82 are disposed on the first surfaces 111a and 121a, respectively. By disposing a functional chip, such as the light receiving unit 81 or the light transmitting unit 82, on the main body parts 111 and 121, potential negative impacts on the optical transceiver module 100 resulting from disposing the functional chip on bended parts 112 and 122 of the first and second flexible circuit boards 11 and 12 can be avoided. Meanwhile, the first and second flexible circuit boards 11 and 12 respectively include adhering parts 113 and 123 for, electrically connecting to the printed circuit board 20.

A first thermally conductive plate 31 and a second thermally conductive plate 32 are respectively disposed on the second surfaces 111b and 121b of the main body parts 111 and 121 of the first and second flexible circuit boards 11 and 12. The first and second thermally conductive plates 31 and 32 are fixed in position relative to the first and second flexible circuit boards 11 and 12, respectively. In some embodiments, the first thermally conductive plate 31 and the second thermally conductive plate 32 are metal plates, in order to efficiently absorb and transmit heat coming from the functional chip, such as the light receiving unit 81 or the light transmitting unit 82.

In order to sustain the relative positions of the first and second flexible circuit boards 11 and 12 and the printed circuit board 20, the first thermally conductive plate 31 and the second thermally conductive plate 32 are respectively connected to the printed circuit boards 20 via supporting parts 71 and 72. Specifically, the supporting parts 71 and 72 respectively include positioning projections 711 and 721 on the ends of the supporting parts 71 and 72 that correspond to the printed circuit board 20. The printed circuit board 20 includes positioning holes 21 and 22 that respectively correspond to the positioning projections 711 and 721. The supporting parts 71 and 72 respectively include engaging pieces 712 and 722 on the ends of the supporting parts 71 and 72 that respectively correspond to the first and second thermally conductive plates 31 and 32. The first and second thermally conductive plates 31 and 32 respectively include engaging slots 311 and 321 that respectively correspond to the engaging pieces 712 and 722. The above-described structure is an exemplary embodiment of the disclosure. Simple structural changes and replacements made to the structure by persons of ordinary skill in the art should not be deemed as beyond the scope of this disclosure.

The optical transceiver module 100 also includes an outer case 40. The printed circuit board 20 fits onto and is covered by the outer case 40. The first thermally conductive plate 31, second thermally conductive plate 32, first flexible circuit board 11, and second flexible circuit board 12 are housed within the outer case 40. The first flexible circuit board 11 is adhered and fixed to the outer case 40 through the first thermally conductive plate 31. The second flexible circuit boards 12 is adhered and fixed to the outer case 40 through the second thermally conductive plate 32. The placement of the first thermally conductive plate 31 and the second thermally conductive plate 32 makes it easier to fix and connect the first and second flexible circuit boards 11 and 12 to the outer case 40, in order to facilitate transmission of the heat generated by the light receiving unit 81 and the light transmitting unit 82 to the outer case 40 for dissipation. In some embodiments, thermally conductive adhesives are placed between the first thermally conductive plate 31 and the body of the outer case 40 and between the second thermally conductive plate 32 and the body of the outer case 40, to secure the assembly and improve the efficiency of thermal conduction.

A heat sink 50 is disposed on the outside of the outer case 40. The heat absorbed by the first and second thermally conductive plates 31 to 32 can be transmitted to the heat sink 50 through the outer case 40 for dissipation into the external environment. The light receiving unit 81 and the light transmitting unit 82 are the main sources of heat in the optical transceiver module 100. For optical transceiver modules having a multiplexing function, the amount of hear generated by the light receiving unit 81 and the light transmitting unit 82 is even greater. In some embodiments, the light receiving unit 81 and the light transmitting unit 82 are disposed on the inner surface of the outer case 40, and the heat sink 50 is disposed on the outer surface of the outer case 40, so that the light receiving unit 81, the light transmitting unit 82, and the hear sink 50 are close to one another. As a result, the heat generated by the light receiving unit 81 and the light transmitting unit 82 can be transmitted to the heat sink 50 through the first and second thermally conductive plates 31 and 32, thereby optimizing the heat dissipation effect of the optical transceiver module 100.

In this embodiment, the heat sink 50 includes a plurality of fins protruding from the outer surface of the outer case 40, in order to enlarge the heat dissipation area. In some alternative embodiments, heat dissipation can be achieved by other means such as attaching cooling pads. In addition, the heat sink 50 can also be understood as the outer surface of the outer case 40, rather than being disposed on the outer case 40 as described in the aforementioned embodiment.

In order to ensure the stability and reliability of the assembly with the outer case 40, the main body parts 111 and 121 of the first and second flexible circuit boards 11 and 12 are disposed in the same plane, thereby ensuring that the first and second thermally conductive plates 31 and 32 are adhered to the inner surface of the outer case 40 in a state that the first and second thermally conductive plates 31 and 32 are approximately located in the same plane. In addition, in order to secure the relative positions of the first and second thermally conductive plates 31 and 32 and the outer case 40, the first and second thermally conductive plates 31 and 32 respectively include mounting holes 312 and 322. The first and second thermally conductive plates 31 and 32 can be fixed to the outer case 40 through a locking member (not shown in the drawing) in conjunction with the mounting holes 312 and 322, respectively. In some alternative embodiments, the first and second thermally conductive plates 31 and 32 can be directly attached to the outer case 40 by using, for example, thermally conductive adhesives, to achieve the same effect.

The signal processing unit 90 is disposed on the first flexible circuit board 11, the second flexible circuit board 12, and/or the printed circuit boards 20. The specific quantity of the signal processing unit 90 and the manner in which the signal processing unit 90 is disposed can be adjusted as required by different applications. FIG. 3 shows an exemplary embodiment in which the signal processing unit 90 is disposed on the second flexible circuit board 12, but the disclosure is not limited thereto. The printed circuit board 20 includes a connecting point for electrical connection with external devices. The signal processing unit 90 processes light signals received by the light receiving unit 81, and transmits the processed signals to the connecting point of the printed circuit board 20. The signal processing unit 90 also processes electrical signals transmitted from the connecting point of the printed circuit board 20, and transmits the processed signals outside of the optical transceiver module 100 through the light transmitting unit 82. Thus, the connecting point enables signal transmission between the optical transceiver module 100 and the outside. In this embodiment, a connector 60 that is electrically connected to the connecting point of the printed circuit board 20 is disposed on a surface of the printed circuit board 20 that faces away from the main body parts 111 and 121 of the first and second flexible circuit boards 11 and 12. The connector 60 facilitates connection with the outside. In a conventional structural design, in order to facilitate signal transmission, the connector 60 is disposed on the same circuit board on which the light receiving unit 81 and the light transmitting unit 82 are disposed. Such design hampers heat dissipation of the light receiving unit 81 and light transmitting unit 82. Therefore, a larger heat sink and a larger heat dissipation space are required in the conventional structural design in order to ensure normal operation of the optical transceiver module 100. In contrast, in this embodiment, this type of issues can be effectively addressed by disposing the connector 60 on a circuit board different from the one on which the light receiving unit 81 and the light transmitting unit 82 are disposed located (i.e., the printed circuit board 20 or the first and second flexible circuit boards 11 and 12), thereby reducing the manufacturing cost of the optical transceiver module 100.

Figure 4:
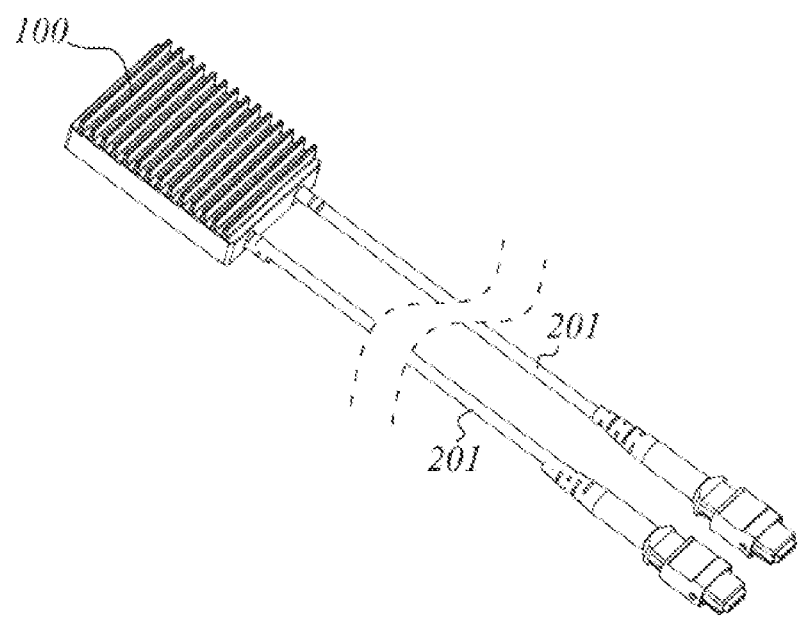
FIG. 4 is a perspective view an optical transceiver module of connected to optical fibers, according to an embodiment of the disclosure.

FIG. 4 schematically illustrates the optical transceiver module 100 connected with optical fibers, accordingly to an embodiment of the disclosure. As shown in FIG. 4, the transmission of light signals from the optical transceiver module 100 to the outside is realized by optical fibers 201. Optical fibers 201 respectively extend through aforementioned supporting parts 71 and 72 to connect with and transmit signals to and from the light receiving unit 81 and the light transmitting unit 82 respectively disposed on the first flexible circuit board 11 and the second flexible circuit board 12.

Figure 5:
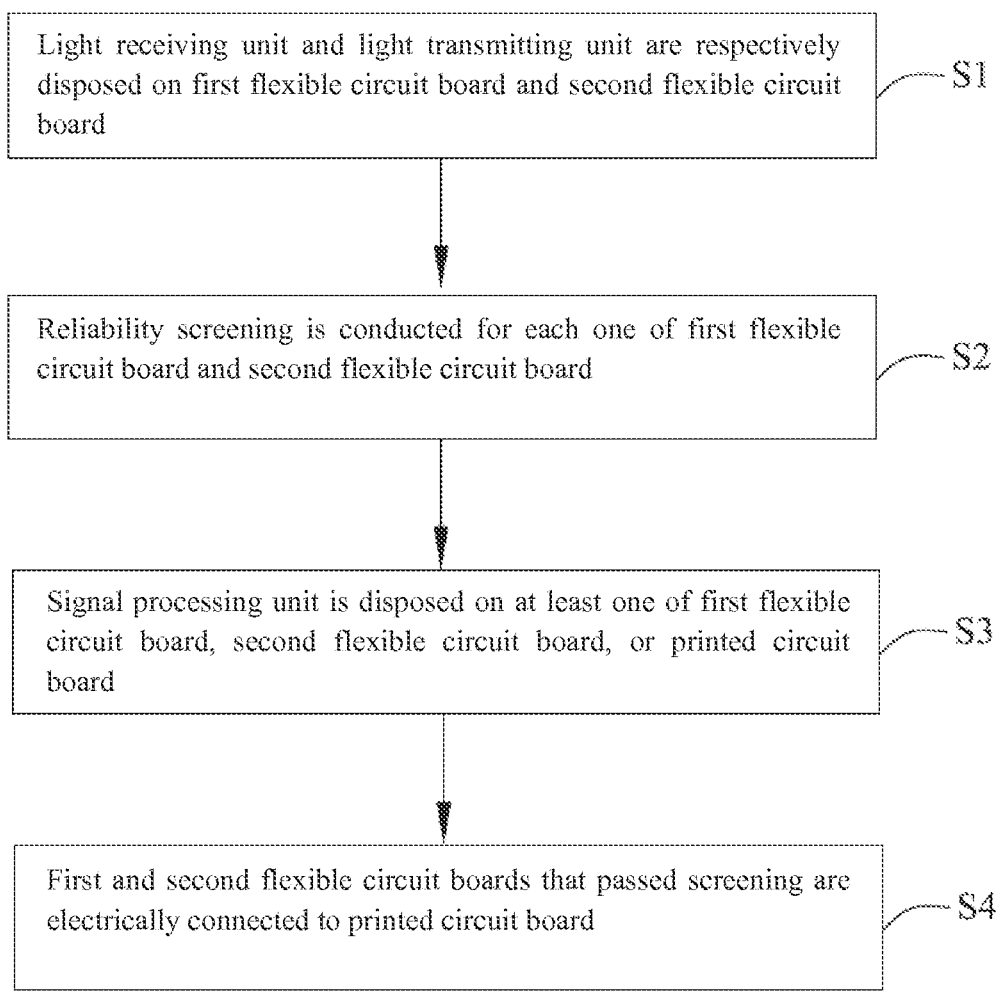
FIG. 5 is a flow chart of a method of assembling an optical transceiver module, according to an embodiment of the disclosure.

FIG. 5 is a flow chart of a method of assembling an optical transceiver module, according to an embodiment of the disclosure. As shown in FIG. 5, the method of assembling the optical transceiver module 100 includes the following steps.

S1. The light receiving unit 81 and the light transmitting unit 82 are disposed on the first flexible circuit board 11 and the second flexible circuit board 12, respectively.

S2. A reliability screening is conducted for each one of the first flexible circuit board 11 and the second flexible circuit board 12.

Each one of the first and second flexible circuit boards 11 and 12 includes a plurality of pads for electrically connecting with the printed circuit board 20. The functions of the first and second flexible circuit boards 11 and 12 can be tested through the pads. If either one of the first and second flexible circuit boards 11 and 12 functions abnormally, a replacement can be made in a timely manner before assembling.

S3. The signal processing unit 90 is disposed on at least one of the first flexible circuit board 11, the second flexible circuit board 12, or the printed circuit board 20.

S4. The first and second flexible circuit boards 11 and 12 that have passed the screening are electrically connected to the printed circuit board 20.

Through the aforementioned assembly method, the embodiment of the disclosure provides the following benefits. Disposing the light transmitting unit 82 and light receiving unit 81 of the optical transceiver module 100 on two flexible circuit boards 11 and 12 allows separate testing of the two flexible circuit boards 11 and 12 before they are assembled. When a defect is detected on one of the flexible circuit boards, rework is performed on only the defective flexible circuit board rather than on the entire optical transceiver module 100, thereby saving manufacturing cost.

It should be understood that despite the descriptions of embodiments, there is not only one independent technical design for each embodiment. The disclosure is written simply for the sake of clarity. Technical personnel in the field should treat the disclosure as a whole. The technical designs in various embodiments may be combined in appropriate ways to form other embodiments that can be understood by technical personnel in the field.

The descriptions above are only intended to provide specific descriptions of feasible embodiments. The detailed descriptions are not to be construed as limiting the scope of protection for the disclosure. All equivalent embodiments or changes that are not detached from the techniques disclosed here should fall under the scope of protection of the disclosure.

What is claimed is:

1. An optical transceiver module comprising:
    a first flexible circuit board and a second flexible circuit board;
    a light receiving unit and a light transmitting unit disposed on said first flexible circuit board and said second flexible circuit board, respectively;
    a printed circuit board connected to said first flexible circuit board and said second flexible circuit board, and including a connecting point; and
    a signal processing unit disposed on at least one of said first flexible circuit board, said second flexible circuit board, or said printed circuit board,
    wherein said signal processing unit processes optical signals received by said light receiving unit and transmits the signals to the connecting point of said printed circuit board, and said signal processing unit processes electrical signals transmitted from the connecting point of said printed circuit board and transmits the signals out through said light transmitting unit, and
    wherein the first flexible circuit board and the second flexible circuit board are positioned in a plane different from a plane where the printed circuit board is positioned.

2. The optical transceiver module according to claim 1, further including an outer case, wherein
    said printed circuit board fits onto and is covered by said outer case,
    said first flexible circuit board and said second flexible circuit board include main body parts on which said light receiving unit and light transmitting units are disposed, respectively; and
    said main body parts are located in said outer case and are partially adhered and fixed to a bottom part of said outer case.

3. The optical transceiver module according to claim 2, further including a heat sink disposed on an outside of said outer case.

4. The optical transceiver module according to claim 2, further including a connector for electrically connecting to the connecting point of said printed circuit board and disposed on a surface of said printed circuit board that faces away from the main body parts of said first and second flexible circuit boards.

5. The optical transceiver module according to claim 1, further including:
    an outer case;
    a first thermally conductive plate disposed between said first flexible circuit board and said outer case, said first flexible circuit board being adhered and fixed to said outer case through said first thermally conductive plate; and
    a second thermally conductive plate disposed between said second flexible circuit board and said outer case, said second flexible circuit board being adhered and fixed to said outer case through said second thermally conductive plate.

6. The optical transceiver module according to claim 5, further including thermally conductive adhesives placed between said first thermally conductive plate and said outer case and between said second thermally conductive plate and the body of said outer case.

7. The optical transceiver module according to claim 5, further including supporting parts attached between said first thermally conductive plate and said printed circuit board and between said second thermally conductive plate and said printed circuit board, respectively, wherein
    the supporting parts respectively include positioning projections on the ends of said supporting parts that correspond to said printed circuit board,
    said printed circuit board includes positioning holes that respectively correspond to said positioning projections,
    said supporting parts respectively include engaging pieces on the ends of the supporting parts that respectively correspond to said first and second thermally conductive plates, and
    said first and second thermally conductive plates respectively include engaging slots that respectively correspond to said engaging pieces.

8. The optical transceiver module according to claim 1, wherein said first flexible circuit board and said second flexible circuit board are connected to two opposite sides of said printed circuit board.

9. The optical transceiver module according to claim 1, wherein said optical transceiver module is connected with optical fibers for transmission of optical signals to the outside.

10. A method of assembling an optical transceiver module, comprising:
- disposing a light receiving unit and a light transmitting unit on a first flexible circuit board and a second flexible circuit board, respectively;
- conducting a reliability screening for each of said first flexible circuit board and said second flexible circuit board;
- disposing a signal processing unit on at least one of said first flexible circuit board, said second flexible circuit board, or a printed circuit board; and
- electrically connecting the first and second flexible circuit boards that have passed the reliability screening to said printed circuit board.

* * * * *